US006586736B1

(12) United States Patent
McCord (10) Patent No.: US 6,586,736 B1
(45) Date of Patent: Jul. 1, 2003

(54) SCANNING ELECTRON BEAM MICROSCOPE HAVING AN ELECTRODE FOR CONTROLLING CHARGE BUILD UP DURING SCANNING OF A SAMPLE

(75) Inventor: Mark A. McCord, Mountain View, CA (US)

(73) Assignee: KLA-Tencor, Corporation, San Jose, CA (US)

( * ) Notice: Subject to any disclaimer, the term of this patent is extended or adjusted under 35 U.S.C. 154(b) by 0 days.

(21) Appl. No.: 09/394,133

(22) Filed: Sep. 10, 1999

(51) Int. Cl.[7] ...................... H01J 37/147; H01J 37/244
(52) U.S. Cl. ................... 250/310; 250/396 R; 250/397
(58) Field of Search ................................ 250/310, 307, 250/397, 398, 396 R (56) References Cited

U.S. PATENT DOCUMENTS

| | | | | |
|---|---|---|---|---|
| 3,736,422 A | * | 5/1973 | Weber et al. | 250/310 |
| 3,952,227 A | | 4/1976 | Van Alphen | 315/17 |
| 3,961,190 A | * | 6/1976 | Lukianoff et al. | 250/310 |
| 4,255,661 A | * | 3/1981 | Liebl | 250/396 R |
| 4,551,599 A | * | 11/1985 | Liebl | 250/310 |
| 4,743,757 A | * | 5/1988 | Coates | 250/310 |
| 4,818,872 A | | 4/1989 | Parker et al. | |
| 4,912,405 A | | 3/1990 | Richardson | 324/751 |
| 4,963,748 A | * | 10/1990 | Szilagyi | 250/398 |
| 5,136,167 A | | 8/1992 | Langner et al. | 250/396 R |
| 5,614,833 A | | 3/1997 | Golladay | 324/751 |
| 6,038,018 A | | 3/2000 | Yamazaki et al. | |
| 6,066,849 A | * | 5/2000 | Masnaghetti et al. | 250/310 |
| 6,172,136 B1 | | 1/2001 | Hiroi et al. | |
| 6,232,787 B1 | | 5/2001 | Lo et al. | |
| 6,252,412 B1 | | 6/2001 | Talbot et al. | |
| 6,344,750 B1 | | 2/2002 | Lo et al. | |

FOREIGN PATENT DOCUMENTS

DE 4412415 A1 10/1994 .......... H01J/37/256

OTHER PUBLICATIONS

Min Bai, et al, "Resist charging in electron–beam lithography," Sep. 1998, SPIE vol. 3546 0277–786X/98.

M. G. R. Thomson, "The electrostatic moving objective lens and optimized deflection systems for microcolumns," Nov./Dec. 1996, Journal of Vacuum Science Technology, B 14(6), Nov./Dec. 1996.

* cited by examiner

*Primary Examiner*—Bruce Anderson
(74) *Attorney, Agent, or Firm*—Beyer Weaver & Thomas, LLP (57) ABSTRACT

A method and apparatus for generating an image of a sample with a electron beam apparatus is disclosed. The image is generated from a portion of the sample with a measurement device having a source unit for directing an electron beam substantially towards the sample. The measurement device also has a detector for detecting particles that are emitted from the sample, an electrode proximal to the sample having a hole through which the electron beam and a portion of the emitted particles may pass, and an image generator for generating the image of the sample from the detected particles. A first voltage is applied to the electrode when the electron beam is substantially in a center of the hole. The first voltage is selected to control positive charge build up on the sample. A second voltage is applied to the electrode when the electron beam is deflected a predetermined distance from the center of the hole. The second voltage is selected to allow a significant amount of emitted particles to reach the detector to facilitate image generation while maintaining charge control.

17 Claims, 6 Drawing Sheets

SCANNING ELECTRON BEAM MICROSCOPE HAVING AN ELECTRODE FOR CONTROLLING CHARGE BUILD UP DURING SCANNING OF A SAMPLE

BACKGROUND OF THE INVENTION

The present invention relates generally to feature measurement in scanning electron microscopy, and more specifically to apparatus and methods for enhancing image quality. The present invention may also be applied to feature measurement and image enhancement in similar instruments.

Figure 1:
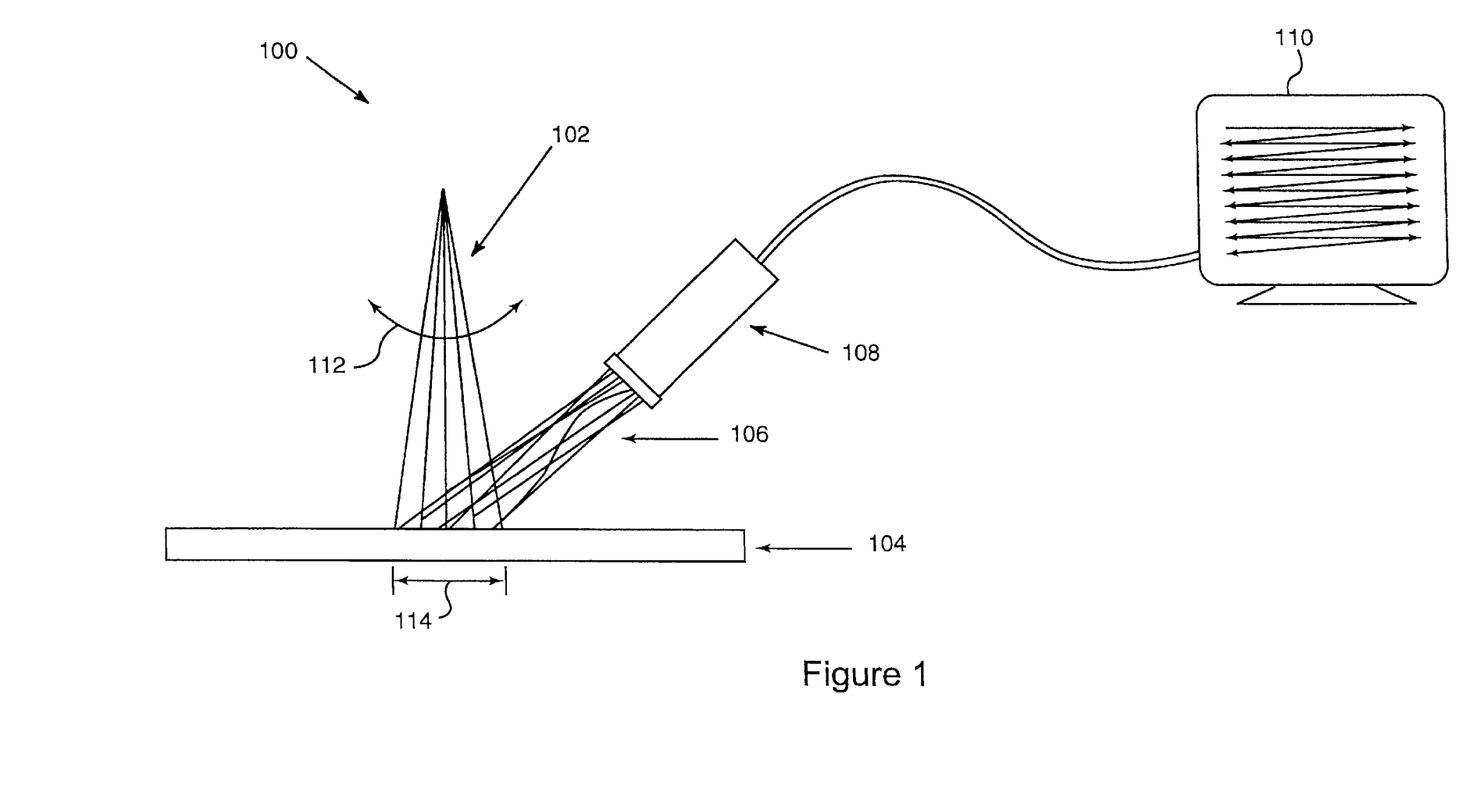
FIG. 1 is a diagrammatic representation of a conventional scanning electron microscopy configuration.

FIG. 1 is a diagrammatic representation of a conventional scanning electron microscopy configuration 100. As shown, a beam of electrons 102 is scanned over a sample 104 (e.g., a semiconductor wafer). Multiple raster scans 112 are typically performed over a small area 114 of the sample 104. The beam of electrons 102 either interact with the sample and cause an emission of secondary electrons 106 or bounce off the sample as backscattered electrons 106. The secondary electrons and/or backscattered electrons 106 are then detected by a detector 108 that is coupled with a computer system 110. The computer system 110 generates an image that is stored and/or displayed on the computer system 10.

Although conventional microscopy systems and techniques typically produce images having an adequate level of quality under some conditions, they produce poor quality images of the sample for some applications. For example, on a sample made of a substantially insulative material (e.g., silicon dioxide), performing one or more scans over a small area sometimes causes the sample to accumulate excess positive charge in the small area relative to the rest of the sample. The excess charge generates a potential barrier for some of the secondary electrons, and this potential barrier inhibits some of the secondary electrons from reaching the detector 108. Since this excess charge is likely to cause a significantly smaller amount of secondary electrons to reach the detector, an image of the small area is likely to appear dark, thus obscuring image features within that small area.

Thus, microscopy apparatus and techniques for improving image quality are needed. More specifically, mechanisms for controlling charge distribution on the surface of the sample are needed.

SUMMARY OF THE INVENTION

Accordingly, the present invention addresses the above problems by providing apparatus and methods for controlling charge distribution on the sample so as to improve image quality. Charge is controlled by providing one or more electrodes over the surface to be scanned. Each electrode has an opening through which a beam of incident particles (e.g., electrons) may pass and strike the surface of the sample. A voltage (e.g., a negative voltage) is applied to the electrode such that at least some of the emitted particles (e.g., secondary electrons) from the surface are repelled away from the electrode and towards the surface to cancel positive charge that has built up on the surface. Additionally, voltage adjustments are made as a function of beam position so that charge is controlled and an image is generated during sample scanning.

In one embodiment, a method of controlling charge build up on a sample while an image is being generated is disclosed. The image is generated from a portion of the sample with a measurement device having a source unit for directing an electron beam substantially towards the sample. The measurement device also has a detector for detecting particles that are emitted from the sample, an electrode proximal to the sample having a hole through which the electron beam and a portion of the emitted particles may pass, and an image generator for generating the image of the sample from the detected particles. A first voltage is applied to the electrode when the electron beam is substantially in a center of the hole. The first voltage is selected to control positive charge build up on the sample. A second voltage is applied to the electrode when the electron beam is deflected a predetermined distance from the center of the hole. The second voltage is selected to allow a significant amount of emitted particles to reach the detector to facilitate image generation. In another embodiment, a continuous range of voltages is applied between the first and second voltage as the beam moves between the center of the hole and to the predetermined distance from the center.

In an alternative embodiment, the first and second voltages are selected such that a substantially same amount of emitted particles reach the detector when either the first voltage or the second voltage is applied. Preferably, the second voltage is also selected to control positive charge build up on the sample.

In another method aspect of the invention, the measurement device has an electrode proximal to the sample that is split into at least two portions forming a hole through which the electron beam and a portion of the emitted particles may pass. A first voltage is applied to the electrode portions when the electron beam is substantially in a center of the hole, and the first voltage is selected to control charge build up on the sample. A second voltage is applied to a first electrode portion when the electron beam is deflected a predetermined distance from the center of the hole while a third voltage is applied to a second electrode portion. The second voltage differs from the first voltage, and the second and third voltages are selected to allow a significant amount of emitted particles to reach the detector to facilitate image generation.

In an alternative embodiment, the electrode has a first and a second half. The first voltage is applied to the first and second halves when the electron beam is substantially in the center of the hole, and the third voltage is applied to the first half and the second voltage is applied to the second half when the electron beam is not substantially in the center of the hole. The third voltage has about a same value as the first voltage. In another embodiment, a continuous range of voltages is applied between the first voltage and the second voltage as the beam moves between the center of the hole and to the predetermined distance from the center.

In another embodiment, the invention pertains to an electron beam apparatus for generating an image from a sample. The apparatus includes an electron beam generator arranged to generate and control an electron beam that is directed substantially towards the sample, a detector arranged to detect charged particles emitted from the sample to allow generation of an image from the detected charged particles, and one or more electrodes arranged proximal to the sample such that a predetermined voltage may be applied to one or more electrodes such that charge build up on the sample is controlled while the electron beam is directed at the sample.

In another embodiment, the apparatus also includes a processor for controlling a plurality of voltages to the one or more electrodes as a function of the electron beam's position. In yet another embodiment, the electrodes include a first and second electrode that each have bores through which the electron beam passes, and the first electrode are placed between the second electrode and the sample. The second electrode is a ground electrode and the first electrode is a wehnelt electrode.

In yet another embodiment, the electrodes include a first and second electrode that each have bores through which the electron beam passes. The first electrode is placed between the second electrode and the sample, and the second electrode is a ground electrode. Preferably, the first electrode is split into two halves such that a different or a same voltage may be applied to each half to control charge build up and to allow emitted particles to reach the detector.

The present invention has several associated advantages. For example, voltages may be adjusted on the described electrode arrangements such that positive charge build up on the sample is minimized. Additionally, the voltage adjustments may be synchronized with the raster scanning of the incident beam such that enough secondary electrons escape the sample to the detector. Thus, a clear image may be generated of the sample even when the incident beam is not within the center of the electrode hole or not normal to the sample.

These and other features and advantages of the present invention will be presented in more detail in the following specification of the invention and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF SPECIFIC EMBODIMENTS

Reference will now be made in detail to specific embodiments of the invention. Examples of these embodiments are illustrated in the accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 2:
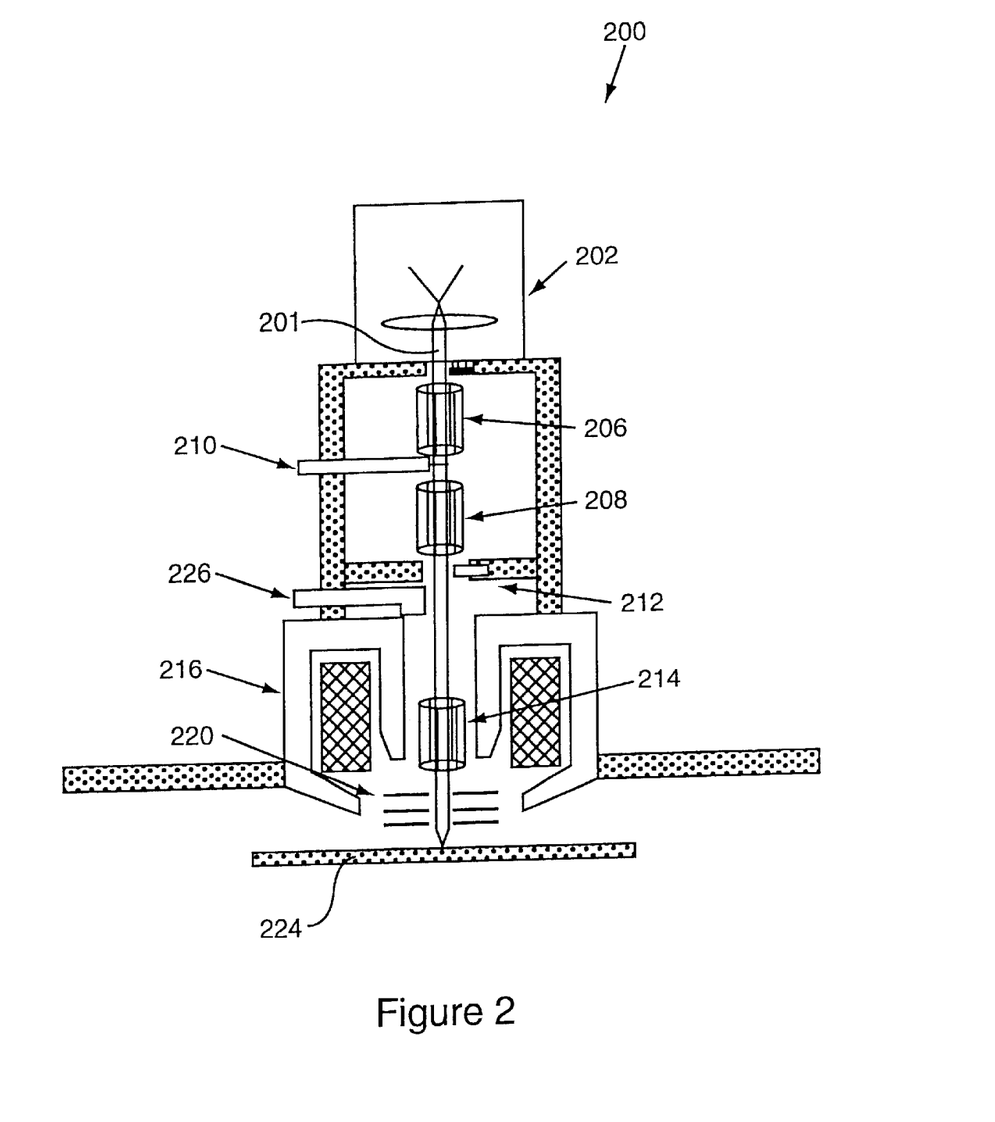
FIG. 2 is a diagrammatic representation of a scanning electron microscope (SEM) system in accordance with one embodiment of the present invention.

The present invention may be implemented within any suitable measurement device that directs charged particles towards a sample and then detects emitted particles from the sample. FIG. 2 is a diagrammatic representation of a scanning electron microscope (SEM) system 200 in accordance with one embodiment of the present invention. The SEM system 200 includes an electron beam generator (202 through 216) that generates and directs an electron beam 201 substantially toward an area of interest on a sample 224. The SEM system 200 also includes a detector 226 arranged to detect charged particles 205 (secondary electrons and/or backscattered electrons) emitted from the sample 224. The SEM also includes an image generator (not shown) for forming an image from the emitted particles. The electron beam generator and detector are further described below, along with other features of the SEM system 200.

The SEM system 200 also includes one or more electrodes 220 configured to control charge on the sample. Each electrode includes a hole through which the beam may pass. The electrode(s) are placed proximal to the sample and charged to a predetermined voltage. In general terms, the predetermined charge results in the generation of an electric field that functions to control charge on the surface of the sample.

In one embodiment, the predetermined voltage is selected to repel some of the particles emitted from the sample back towards the sample such that charge accumulated on the surface of the sample is controlled. For example, a portion of the secondary electrons emitted from the sample are repelled back to the sample surface to cancel positive charge build up on the sample surface. The predetermined voltage is also chosen such that some of the particles emitted from the sample pass through the hole of the electrodes to the detector. In other words, the electrode's predetermined voltage is selected to allow enough emitted particles to reach the detector and image generator such that the image may be analyzed (e.g., for defects).

Figure 3A:
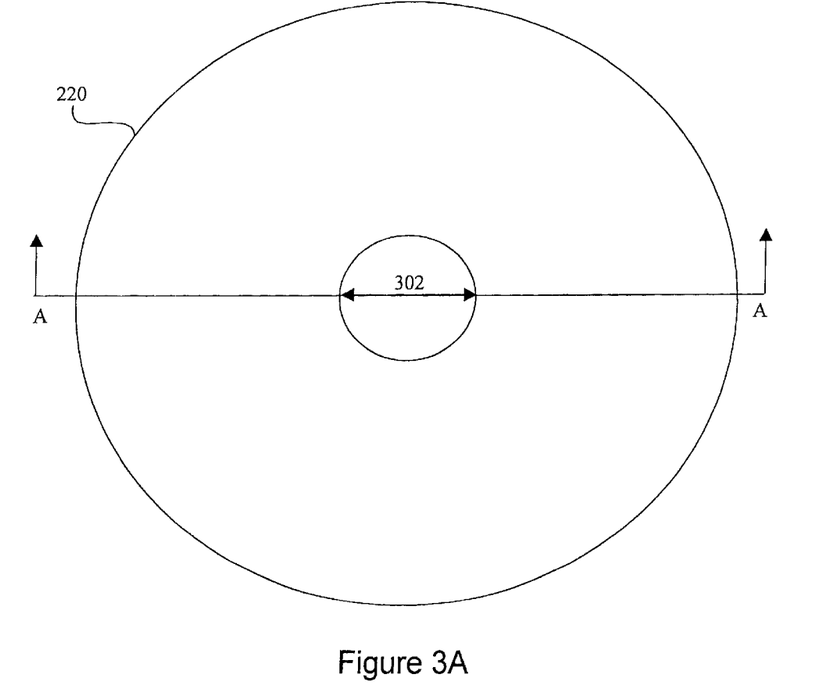
FIGS. 3A and 3B are diagrammatic representations of a first configuration of electrodes of FIG. 2 in accordance with one embodiment of the present invention.

FIGS. 3A and 3B are diagrammatic representations of a first configuration of electrodes 220 of FIG. 2 in accordance with one embodiment of the present invention. FIG. 3A is a top view of the electrodes 220. As shown, each electrode 220 takes the form of a circular plate having a circular hole 302. Of course, any appropriate shape for the plate and hole may be utilized to control charge on the sample.

Figure 3B:
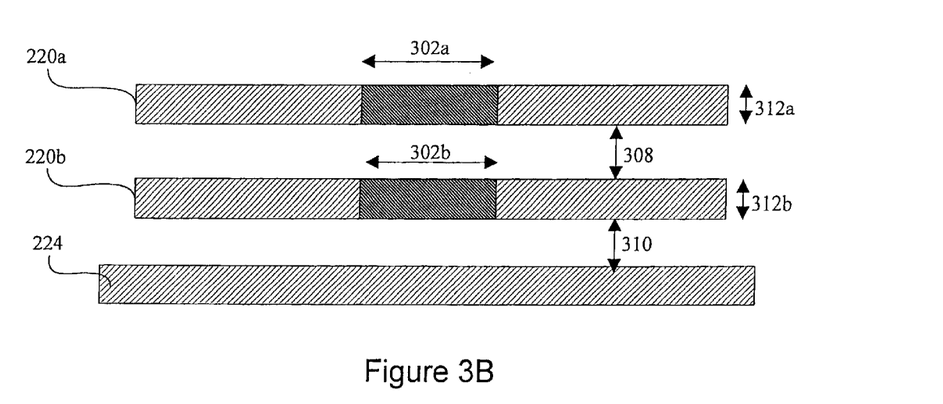

FIG. 3B is a side view of the electrodes 220a and 220b arranged over sample 224. The particular dimensions of the electrodes 220 and the holes 302a and 302b and the distances between each electrode and the sample are selected to control charge on the sample while an image is being acquired. Well known simulation tools are available that allow one to input the dimensions and voltages of various optical elements and simulate resulting effects (e.g., characteristics of the charge build up on the sample, the incident beam, and particles emitted from the sample). By way of example, the software program "Optics" and E03D from MEBS Ltd. work well.

In one specific embodiment, both electrodes 220 are two millimeters thick. The ground electrode 220a has a five millimeter bore and has a distance 308 of five millimeters from the second electrode 220b. The second electrode (also referred to as a "wehnelt electrode") has a two millimeter bore and has a distance 310 of one millimeter from the sample 224. The sample 224 is set to a voltage of minus 9000 volts; the top electrode 220a is set to zero volts; and the second electrode 220b is set to a voltage of minus 9010 volts. These voltage settings (along with voltage settings of 10,000 volts of the SEM beam energy) result in a landing energy of 1000 volts at the sample 224.

It has been found that these voltages and dimensions work well when the incident beam is normal to the sample and near the center of the electrode bore. That is, these voltage settings and electrode configurations allow enough emitted particles to escape the sample, reach the detector, and generate an acceptable image. Additionally, these voltage settings and configurations allow charge to be controlled at the surface by repelling a portion of the emitted particles back towards the sample. These repelled particles may then cancel a portion of the charged particles that are build up on the sample. For example, the charge build up on the sample is a positive charge, while the repelled particles have a negative charge (i.e., they are electrons). Of course, other voltages may be used with other electrode arrangements, for example.

However, when the beam is deflected from the center of the bore (or optical axis), a large portion of the emitted particles are repelled towards the sample. This may result in poor charge control due to an excess of particles returning to the surface (e.g., negative charge buildup). Also, there is a deficiency of emitted particles reaching the detector to form an acceptable image. In other words, the image appears dark compared to the image generated when the incident beam was normal to the sample.

To compensate for this effect, the voltage of the wehnelt electrode 220b is adjusted to allow more emitted particles to escape when the incident beam is not centered on the optical axis. For example, the wehnelt voltage is adjusted such that about the same amount of emitted particles escape to the detector for the on axis incident beam and the off-axis incident beam. One way to accomplish this result is to raise the voltage of the wehnelt electrode 220b such that the saddle electric field generated by the wehnelt electrode widens by the amount that the beam is being deflected from the normal. This widening of the saddle field allows more emitted particles to escape towards the detector while still controlling sample charge build up. In the illustrated embodiment, when the voltage of the wehnelt electrode 220b goes from minus 9010 volts to minus 9008 volts, it appears that this voltage change allows for a 1.0 millimeter incident beam deflection.

Figure 4A:
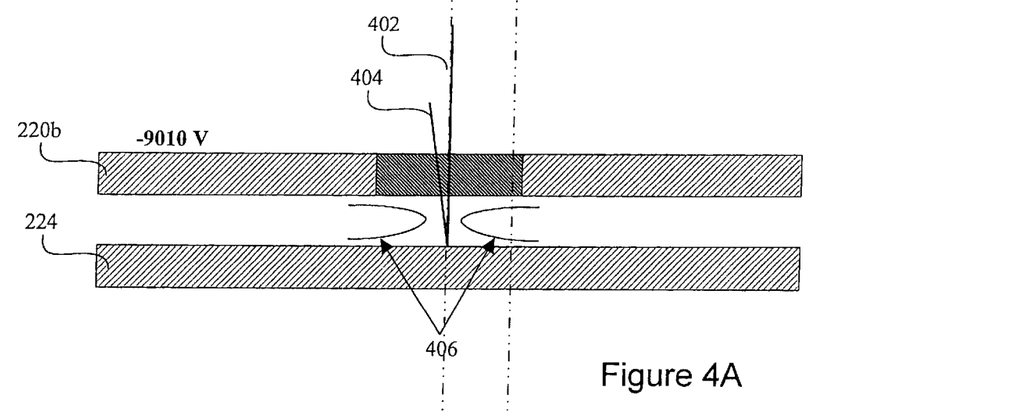
FIG. 4A shows the electrode arrangement of FIGS. 3A and 3B with an incident beam that is normal to the surface of the sample.

FIG. 4A shows the electrode arrangement of FIGS. 3A and 3B with an incident beam 402 that is normal to the surface of the sample 224. In this embodiment, the voltage of the wehnelt electrode is selected such that the resulting electric field 406 is arranged in a saddle shape around the incident beam 402, as well as emitted particles 404. For the electrode configuration of FIGS. 3A and 3B, the voltage of wehnelt electrode 220b is set to minus 9010 volts. The electric field 406 repels a portion of the emitted particles back toward the sample surface 224. The repelled particles may then cancel out charge that is build up on the surface. For instance, secondary electrons that are repelled back towards the sample 224 will cancel any positive charge build up on the sample 224.

Figure 4B:
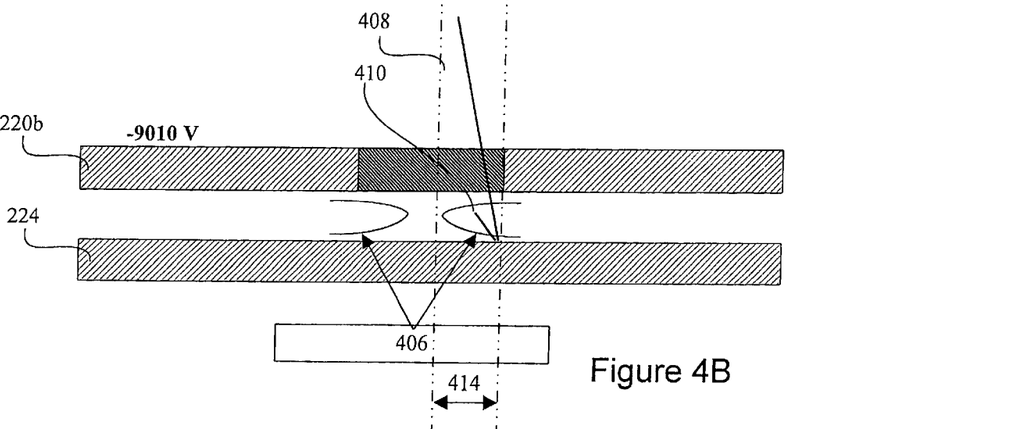
FIG. 4B illustrates an incident beam that is deflected away from the optical axis and the results from keeping the wehnelt electrode at the same voltage that was used to control charge build up when the incident beam was normal to the sample.

FIG. 4B illustrates an incident beam that is deflected away from the optical axis and the results from keeping the wehnelt electrode 220B at the same voltage that was used to control charge build up when the incident beam was normal to the sample. As shown, the incident beam 408 is deflected by a distance 414 from the normal. In this example, the deflection distance is one millimeter. As shown, the resulting electric field 406 forms a barrier to a substantial portion of the emitted particles 410. Since a substantial portion of the emitted particles cannot escape from the sample 224, the image will appear dark. This may result in an unacceptable image of the sample surface. Also, the large number of particles returning to the surface may cause a surface charge buildup.

Figure 4C:
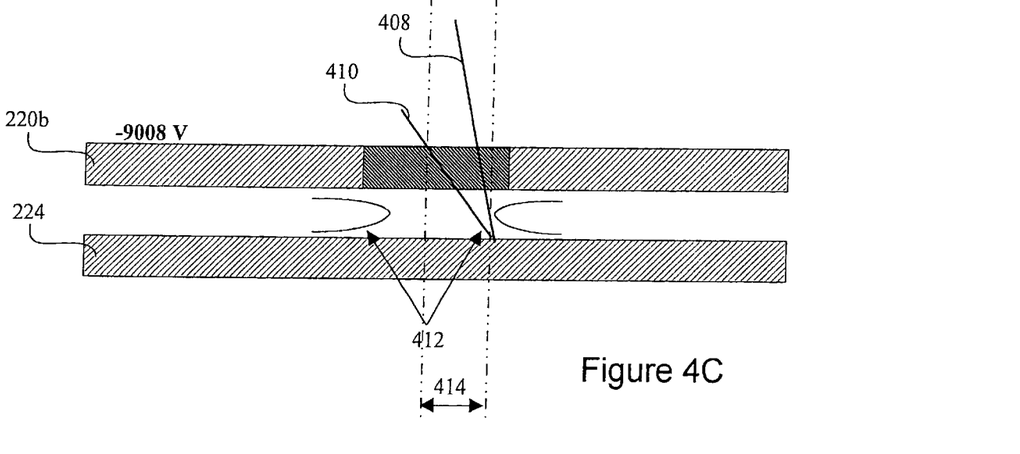
FIG. 4C illustrates the results from changing the wehnelt electrode's voltage such that a significant amount of emitted particles may escape and reach the detector when the incident beam is deflected from the center of a hole in the wehnelt electrode in accordance with one embodiment of the present invention.

FIG. 4C illustrates the results from changing the wehnelt electrode's voltage such that a significant amount of emitted particles may escape and reach the detector when the incident beam 408 is deflected from the normal in accordance with one embodiment of the present invention. For example, the wehnelt electrode voltage is set to minus 9008 volts. This results in a widening of the gap between the saddle lines of the electric field 412. This gap is wide enough to allow entry of the incident beam 408 and exit of a substantial portion of the emitted particles 410. Additionally, the electric field 412 still serves as a barrier to some of the emitted particles so that they are repelled back towards the surface to control charge build up. For example, spurious emitted particles (e.g., that do not have an exit angle that is normal to the sample surface) are blocked by the field 412.

In sum, a larger escape area is created by increasing the voltage on the electrode 220b. That is, the voltage of the wehnelt electrode may be adjusted and synchronized with deflection of the incident beam. Adjustments to the wehnelt electrode may be made in synchronization with the raster scanning of the incident beam. As the incident beam moves from the normal or is deflected by a particular distance, the voltage of the wehnelt electrode may be increased to widen the saddle field generated by the wehnelt electrode so that the saddle field, in effect, moves out of the way of a substantial portion of the incident beam and emitted particles.

The electrode configuration described with reference to FIGS. 3A and 3B and techniques for utilizing this configuration described with reference to FIGS. 4A and 4C are merely illustrative. That is, these configurations and techniques are not meant to limit the scope of the invention. For example, other electrode shapes, sizes, arrangement dimensions, and voltages may be utilized to both control charge build up on the sample and generate an acceptable image. Techniques for simulating the effects of various electrode arrangements are well known to those skilled in the art. In other words, various electrode arrangements may be quickly tested to determine whether a particular arrangement controls charge build up and allows enough emitted particles to escape under various incident beam conditions.

Figure 5A:
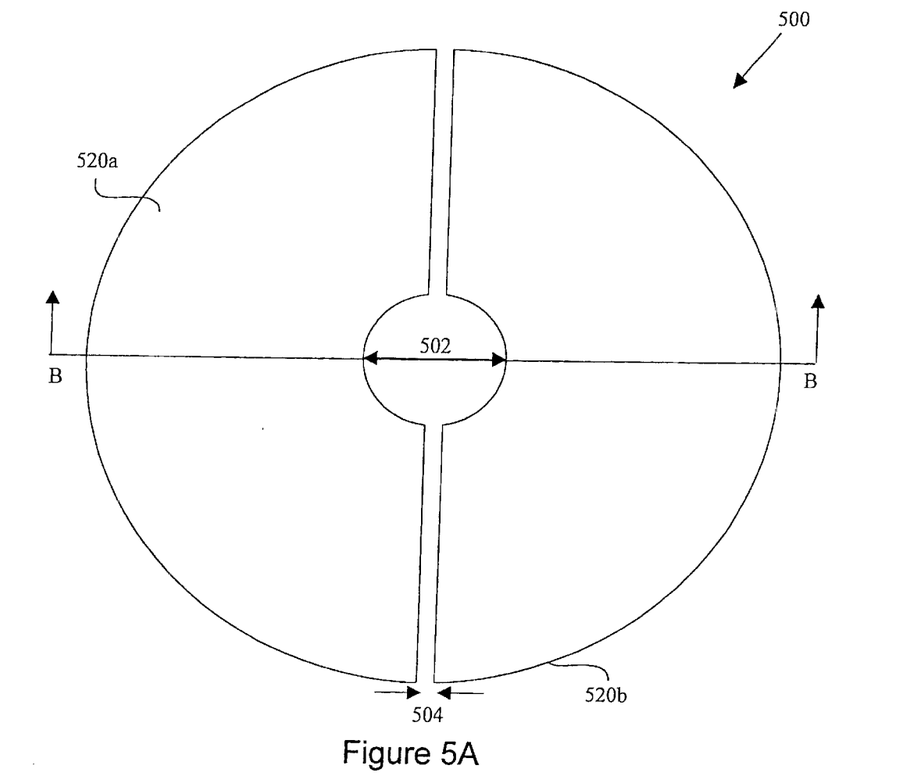
FIGS. 5A and 5B are diagrammatic representations of a split electrode arrangement in accordance with an alternative embodiment of the present invention.
Figure 5B:
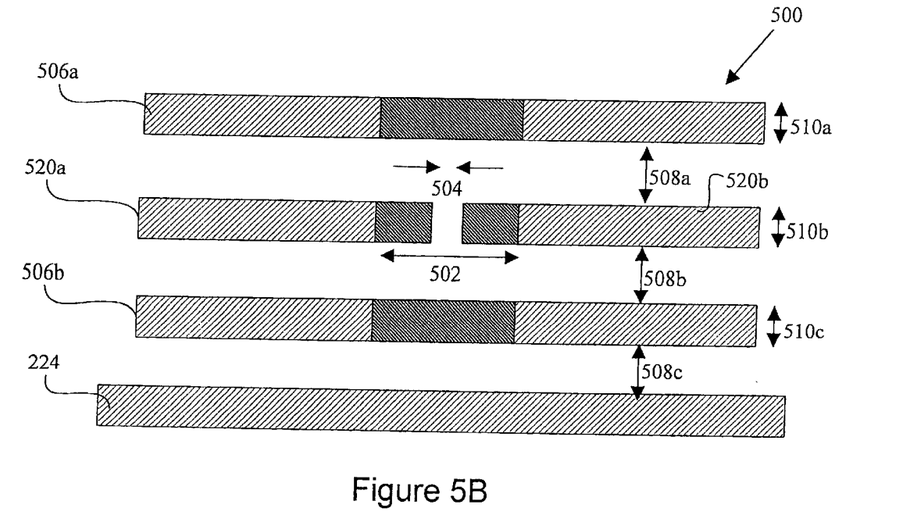

FIGS. 5A and 5B are diagrammatic representations of an electrode arrangement 500 in accordance with an alternative embodiment of the present invention. FIG. 5B shows a side view of the electrode arrangement 500 over a sample 224. A first electrode 506b is placed above the sample 224; a second electrode 520 is placed over the first electrode 506b; and a third electrode 506a is placed over the second electrode 520.

The first and third electrodes 506 are in the form of a circular electrode having a bore 502. The second electrode 520 is in the form of a circular split electrode having a bore 502.

As shown in top view FIG. 5A, the electrode 520 is split into two circular halves 520a and 520b that are separated by gap 504. Of course, the electrode may be split into any number of portions. Alternatively, the first electrode and/or the third electrode's may be eliminated. The dimensions of the electrodes and the distances between each electrode and sample may be any suitable values for controlling charge build up and generating an image. In one specific embodiment, the bore 502 of all three electrodes has a 10 millimeter diameter. The bottom electrode 506b has a thickness 510c of one millimeter. The distance 508c between the bottom electrode 506b and the sample 224 is 2 millimeters. The distance 508c between the split electrode 520 and the bottom electrode 506b is 2 millimeters. The split electrode 520 has a thickness 510B of 1 millimeter. The top electrode 506a is the ground electrode, and has a thickness 510a of 2 millimeters. The distance 508a between the split electrode 520 and the ground electrode 506a is 6.5 millimeters.

The electrodes may each be set to any suitable voltage for controlling charge build up and generating an image. In one embodiment, the ground electrode 506a is set to zero volts; the bottom electrode 506b is set to minus 9000 volts, as well as the sample; and both sides of the set electrode 520a and 520b are set to minus 10,455 volts. These voltage settings result in adequate charge control when the incident beam is normal to the sample surface. When the beam shifts by one millimeter, one side of the split electrode 520a is set to minus 10,105 volts, while the other side 520b is set to minus 10,889 volts. This voltage difference between the two electrode halves 520a and 520b results in a saddle field that allows an adequate amount of emitted particles to escape to the deflector.

Figure 6A:
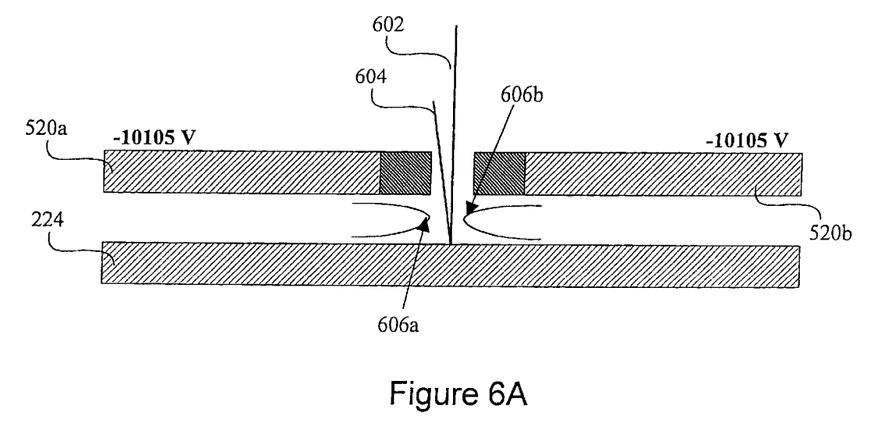
FIGS. 6A through 6B illustrates using the split electrode arrangement of FIGS. 5A and 5B for controlling charge during beam deflection in accordance with one embodiment of the present invention.
Figure 6B:
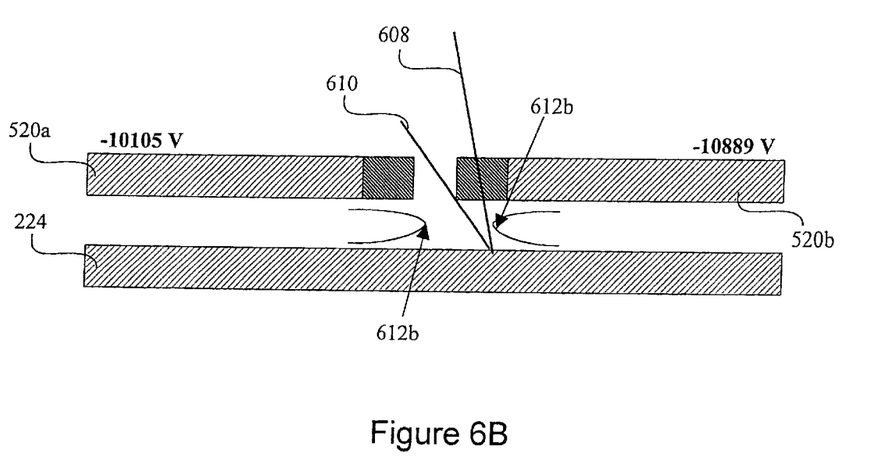

FIGS. 6A through 6B illustrates using the split electrode arrangement 500 of FIGS. 5A and 5B for controlling charge during beam deflection in accordance with one embodiment of the present invention. FIG. 6A illustrates a normal incident beam 602 directed toward sample 224. As shown, each half of the electrode 520 is set to minus 10,455 volts. This results in a tight saddle field 606 around the incident beam and emitted particles. Although a substantial portion of emitted particles escape to the detector, the saddle field also blocks a portion of the emitted particles such that they are repelled back to the sample 224. The repelled particles facilitate charge control on the sample.

FIG. 6B shows a deflected incident beam 608 and its resulting emitted particle beam 610. A first half 520a of the split electrode is set to minus 10,105 volts, while a second half 520b of the split electrode is set to minus 10,889 volts. This voltage difference between the two halves of the split electrode 520 results in a shift in the electric saddle field 612. This shifting saddle field 612 allows a substantial portion of the emitted particles 610 to also escape when the incident beam 608 is deflected from the normal. Of course, a portion of the emitted particles are also repelled by the saddle field back towards the sample to control charge build up.

Referring back to FIG. 2, the electron beam generator may be arranged in any suitable configuration for generating an electron beam that will result in secondary electrons being emitted from the sample 224. As shown, the electron beam generator includes an electron source unit 202, an alignment octupole 206, an electrostatic predeflector 208, a variable aperture 210, a wien filter 214, and a magnetic objective lens 216.

The source unit 202 may be implemented in any suitable form for generating and emitting electrons. For example, the source unit 202 may be in the form of a filament that is heated such that electrons within the filament are excited and emitted from the filament. The octupole 206 is configured to align the beam after a particular gun lens voltage is selected. In other words, the beam may have to be moved such that it is realigned with respect to the aperture.

The aperture 210 forms a hole through which the beam is directed. The lower quadrupole 208 may be included to compensate for mechanical alignment discrepancies. That is, the lower quadrupole 208 is used to adjust the alignment of the beam with respect to any misaligned through-holes of the SEM through which the beam must travel.

The Wien filter 214 provides a B×E field (e.g., a magnetic field's direction is perpendicular and directed away from a direction of an electric field) that is normal to the electron beam is path. The Wien filter 214 applies an E force on the beam that is opposite to the B force that is applied on the beam. Thus, the Wien filter does not substantially move the beam off axis. However, the Wien filter 214 applies the E force and B force on secondary electrons emitted from the sample in a same direction that is towards the detector 226. Thus, the Wien filter 214 deflects secondary electrons towards the detector 226. The Wien filter 214 and/or octopole 206 and/or quadrapole 208 may be configured to direct the beam across an area of the sample. By setting the X and Y scan voltages, a particular beam pattern may be selected. The deflection system may include a processor that may be also configured to control voltage settings on the electrodes, as well as scan voltages, as a function of incident beam position.

The magnetic objective lens 216 provides a mechanism for accelerating the beam towards the sample. A plurality of electrostatic lens (not shown) may provide fast focus of the beam onto the sample surface. The SEM system 200 may include a support (not shown) for supporting the sample 224.

The SEM system 200 may include a detector 226. The SEM system 200 may also include an image generator (not shown) arranged to receive the detected signal and generate and/or store an image. The detected signal is then used to generate the image. Thus, the SEM system 200 may also include an analog to digital converter for converting the detected signal into a digital signal. The SEM system 200 may also include a computer system for processing the image frame data to generate an image of the sample. For example, successive image frame data may be averaged together to create the image.

Although the invention has been described as being implemented on the SEM system 200 of FIG. 2, of course, another SEM system may be implemented. By way of example, the source may expel electrons at an eV that is substantially equal to the final landing energy value, and the electrons are then accelerated through a series of lens that are set at large positive potentials. As the electrons are expelled from the series of lens, the electrons then slow down and hit the sample at the final landing energy. The series of lenses may throw out a large extraction field out of the objective lens, which acts to decelerate the electron beam, while accelerating the secondary electrons that are emitted from the sample. Additionally, the present invention may be implemented on similar measurement devices to control surface charge build up.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. For example, the sample may be any substance or object that is suitable for SEM inspection, such as a semiconductor wafer or reticle. Additionally, the present invention may be especially useful in inspecting thin film heads within hard disks, which are being designed with smaller and smaller dimensions.

Accordingly, the present embodiments are to be considered as illustrative and not restrictive, and the invention is not to be limited to the details given herein, but may be modified within the scope and equivalents of the appended claims.

What is claimed is:

1. A method of controlling charge build up on a sample while an image is being generated of a portion of the sample with a measurement device having a source unit for directing an electron beam substantially towards the sample, a detector for detecting particles that are emitted from the sample, an electrode proximal to the sample having a hole through which the electron beam and a portion of the emitted particles may pass, and an image generator for generating the image of the sample from the detected particles, the method comprising:

applying a first voltage to the electrode when the electron beam is substantially in a center of the hole, the first voltage being selected to control positive charge build up on the sample; and applying a second voltage to the electrode when the electron beam is deflected a predetermined distance from the center of the hole, the second voltage being selected to allow a significant amount of emitted particles to reach the detector to facilitate image generation.

2. A method as recited in claim 1 wherein the first voltage and the second voltage are selected such that a substantially same amount of emitted particles reach the detector when either the first voltage or the second voltage is applied.

3. A method as recited in claim 1 wherein the second voltage is also selected to control positive charge build up on the sample.

4. A method as recited in claim 1 wherein the second voltage has a higher value than the first voltage.

5. A method as recited in claim 1 further comprising applying a continuous range of voltages between the first and second voltage as the beam moves between the center of the hole and to a position that is not within the center.

6. A method of controlling charge build up on a sample while an image is being generated of a portion of the sample with a measurement device having a source unit for directing an electron beam substantially towards the sample, a detector for detecting particles that are emitted from the sample, an electrode proximal to the sample that is split into at least two portions forming a hole through which the electron beam and a portion of the emitted particles may pass, and an image generator for generating the image of the sample from the detected particles, the method comprising:

applying a first voltage to the electrode portions when the electron beam is substantially in a center of the hole, the first voltage being selected to control charge build up on the sample; and applying a second voltage to a first electrode portion when the electron beam is deflected a predetermined distance from the center of the hole while applying a third voltage on a second electrode portion, the second voltage differing from the first voltage, the second voltage being selected to allow a significant amount of emitted particles to reach the detector to facilitate image generation.

7. A method as recited in claim 6 wherein the second and third voltages are also selected to control charge build up on the sample.

8. A method as recited in claim 6 wherein the first voltage, the second voltage, and the third voltage are selected such that a substantially same amount of emitted particles reach the detector when either the first voltage or the second voltage and third voltage are applied.

9. A method as recited in claim 6 wherein the second and third voltages are also selected to control positive charge build up on the sample.

10. A method as recited in claim 6 wherein the second voltage has a higher value than the first voltage.

11. A method as recited in claim 6 wherein the electrode has a first and a second half and the first voltage is applied to the first and second halves when the electron beam is substantially in the center and the third voltage is applied to the first half and the second voltage is applied to the second half when the electron beam is not substantially in the center of the hole, wherein the third voltage is a about a same voltage as the first voltage.

12. A method as recited in claim 6 further comprising applying a continuous range of voltages between the first voltage and the second voltage as the beam moves between the center of the hole and to the predetermined distance from the center.

13. An electron beam apparatus for generating an image from a sample, comprising:

an electron beam generator arranged to generate and control an electron beam that is directed substantially towards the sample;

a detector arranged to detect charged particles emitted from the sample to allow generation of an image from the detected charged particles;

one or more electrodes arranged proximal to the sample such that a predetermined voltage may be applied to one or more electrodes such that charge build up on the sample is controlled while the electron beam is directed at the sample, each of the one or more electrodes having an aperture through which the electron beam passes; and a processor for controlling a plurality of voltages to the one or more electrodes as a function of the electron beam's position.

14. An electron beam apparatus for generating an image from a sample, comprising:

an electron beam generator arranged to generate and control an electron beam that is directed substantially towards the sample;

a detector arranged to detect charged particles emitted from the sample to allow generation of an image from the detected charged particles; and one or more electrodes arranged proximal to the sample such that a predetermined voltage may be applied to one or more electrodes such that charge build up on the sample is controlled while the electron beam is directed at the sample, each of the one or more electrodes having an aperture through which the electron beam passes; wherein the one or more electrodes include a first and second electrode that each have bores through which the electron beam passes, the first electrode being placed between the second electrode and the sample, the second electrode being a ground electrode and the first electrode being a wehnelt electrode.

15. An apparatus as recited in claim 13 wherein the electrodes include a first and second electrode that each have bores through which the electron beam passes, the first electrode being placed between the second electrode and the sample, the second electrode being a ground electrode.

16. An electron beam apparatus for generating an image from a sample, comprising:

an electron beam generator arranged to generate and control an electron beam that is directed substantially towards the sample;

a detector arranged to detect charged particles emitted from the sample to allow generation of an image from the detected charged particles; and one or more electrodes arranged proximal to the sample such that a predetermined voltage may be applied to one or more electrodes such that charge build up on the sample is controlled while the electron beam is directed at the sample, each of the one or more electrodes having an aperture through which the electron beam passes; wherein the one or more electrodes include a first and second electrode that each have bores through which the electron beam passes, the first electrode being placed between the second electrode and the sample, the second electrode being a ground electrode, and wherein the first electrode is split into two halves such that a different or a same voltage may be applied to each half to control charge build up and to allow emitted particles to reach the detector.

17. An apparatus as recited in claim 16 wherein the electrodes includes a third electrode placed between the sample and the first electrode, the third electrode being a ground electrode.

* * * * *